United States Patent
Yamakawa

(10) Patent No.: US 6,479,777 B2
(45) Date of Patent: Nov. 12, 2002

(54) ELECTRONIC PARTS CONVEYING APPARATUS AND METHOD

(75) Inventor: Masakazu Yamakawa, Moriyama (JP)

(73) Assignee: Murata Manufacturing Co., Inc., Nagaokakyo (JP)

(*) Notice: Subject to any disclaimer, the term of this patent is extended or adjusted under 35 U.S.C. 154(b) by 0 days.

(21) Appl. No.: 09/175,545

(22) Filed: Oct. 20, 1998

(65) Prior Publication Data

US 2001/0013486 A1 Aug. 16, 2001

(30) Foreign Application Priority Data

Nov. 12, 1997 (JP) .............................................. 9-329566

(51) Int. Cl.⁷ .............................................. B07C 5/344
(52) U.S. Cl. ........................ 209/574; 209/643; 209/644; 209/905; 209/919; 209/932; 198/471.1
(58) Field of Search .................................. 209/571, 572, 209/573, 574, 643, 644, 905, 919, 932; 198/438, 493, 469.1, 470.1, 471.1

(56) References Cited

U.S. PATENT DOCUMENTS

| 3,920,541 A | | 11/1975 | VandenBerg et al. ... 209/905 X |
| 4,008,805 A | * | 2/1977 | Goerke et al. .......... 209/919 X |
| 4,154,672 A | * | 5/1979 | Wiley et al. ............ 209/905 X |
| 4,785,928 A | | 11/1988 | Hinchcliffe et al. ......... 198/450 |
| 4,907,701 A | * | 3/1990 | Kobayashi et al. ......... 209/576 |
| 5,568,870 A | * | 10/1996 | Utech ......................... 209/573 |

FOREIGN PATENT DOCUMENTS

| BE | 828 982 | | 11/1975 | |
| DE | 3616542 | | 5/1986 | |
| EP | 427611 | * | 5/1991 | ............. 209/919 |
| EP | 0 635 315 | | 1/1995 | |
| JP | 2-20490 | | 5/1990 | |
| JP | 2-193813 | * | 7/1990 | ............. 209/643 |
| JP | 3-8619 | | 1/1991 | |
| JP | 3-162310 | | 7/1991 | |
| JP | 6-1337 | | 1/1994 | |
| JP | 06329249 | | 11/1994 | |
| JP | 7-149422 | | 6/1995 | |
| SU | 1115-970 | | 9/1984 | |

\* cited by examiner

*Primary Examiner*—Tuan N. Nguyen
(74) *Attorney, Agent, or Firm*—Burns, Doane, Swecker & Mathis, LLP

(57) ABSTRACT

An electronic parts conveying apparatus reduces damage to electronic parts (e.g., chip-type electronic parts) and stabilizes the positions of the electronic parts during a conveying operation. The conveying apparatus has a conveying table having, on its entire outer-peripheral section, concave storage slots formed with identical pitches that store the electronic parts in series. The conveying table also has air holes, each of which passes through a respective concave storage slot. One end of the air hole terminates in an opening disposed on an inner-circumferential side surface of the concave storage slot. The other end of the air hole communicates through a selector valve with a negative air pressure source, which generates negative air pressure suction applied to suction the electronic part into the concave storage slot. The hole is also connected with a positive air pressure source, which generates air pressure to eject the electronic part from the concave storage slot.

14 Claims, 6 Drawing Sheets

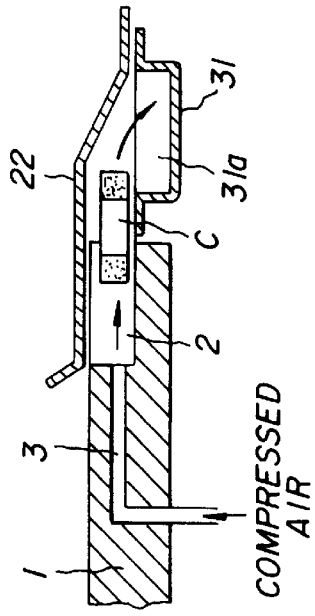
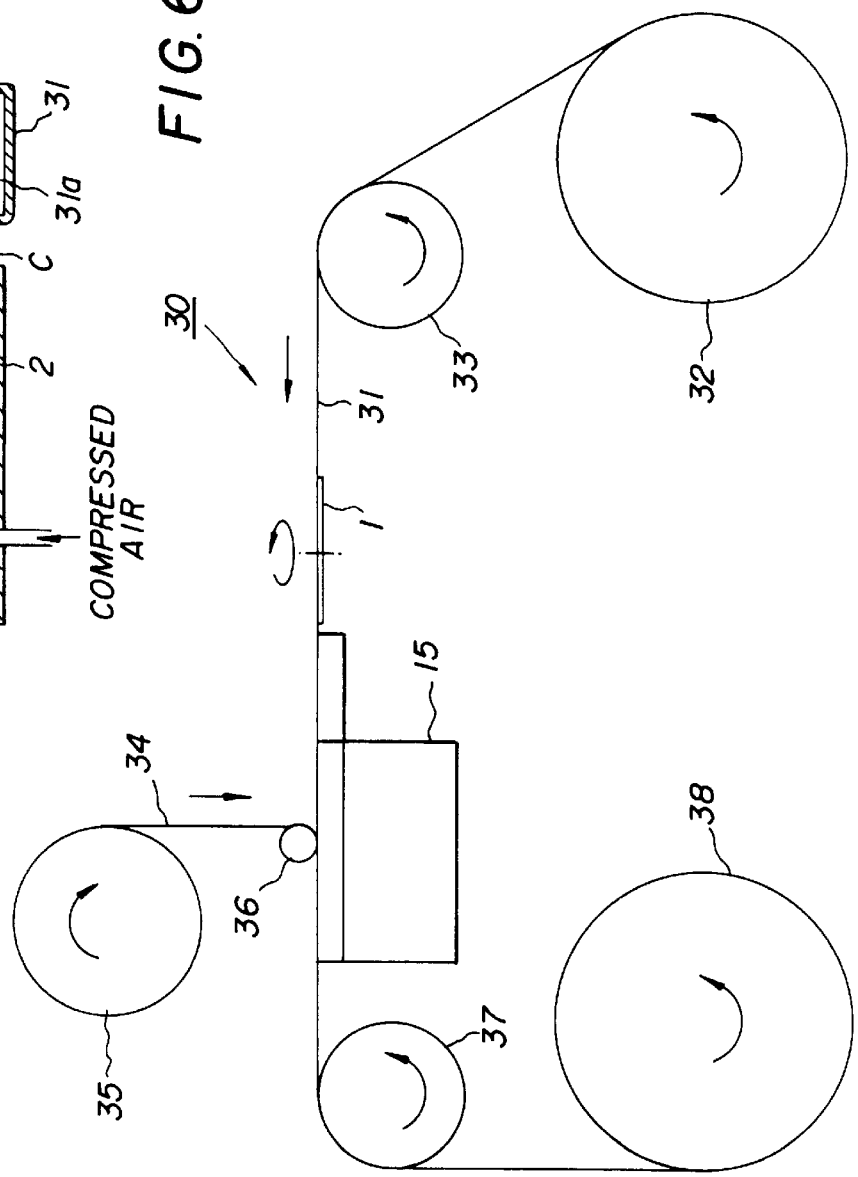

ELECTRONIC PARTS CONVEYING APPARATUS AND METHOD

This application corresponds to Japanese Patent Application No. 9-329566, filed on Nov. 12, 1997, which is hereby incorporated by reference in its entirety.

BACKGROUND

1. Field of the Invention

The present invention relates to a conveying apparatus (and, more generally, a parts handling apparatus) that conveys electronic parts such as chip-type capacitors and resistors, and a method for use thereof.

2. Description of the Related Art

Japanese Examined Patent Publication No. 2-20490 discloses a conveying apparatus that automatically stores electronic parts on a carrier tape fed by a parts feeder. This conventional conveying apparatus feeds electronic parts, conveyed by means of vibration, from a feed track of the parts feeder into pocket slots formed on the entire circumference of a gear-like conveying ring. The apparatus then loads the electronic parts into concave sections of a carrier tape and applies an adhesive cover tape onto the carrier tape. The conventional apparatus has, between an exit end of the feed track of the parts feeder and the gear-like conveying ring, a guiding support plate grooved for engagement with teeth of the conveying ring. The apparatus also has vacuum paths with outer ends having suction holes. Using the above-described structure, this conventional conveying apparatus feeds the electronic parts in the pocket slots through the feed track.

In the related art, however, the conveying apparatus causes the following problems. While the electronic parts stored in the pocket slots are being conveyed, the lower surfaces of the electronic parts slide in contact with the upper surface of the guiding support plate. When the electronic parts having outer electrodes at both ends are being conveyed, abrasions and scratches may be caused on the lower surfaces of the outer electrodes. The abrasions and scratches can also be caused on the end surfaces of the outer electrodes because these surfaces may slide in contact with the inner-circumferential surface of the guiding support plate during the rotation. This can easily occur during the conveying operation despite the use of an arcuate inner-circumferential surface of the guiding support plate designed to prevent the electronic parts from being propelled in the outer-peripheral direction.

During the conveying operation, for measurement of electrical characteristics of the electronic parts, the electronic parts need to be precisely positioned in the pocket slots. However, reliably setting contact electrodes in contact with outer electrodes of the electronic parts has been difficult because parts that are offset in the outer-peripheral direction are unstable because of the centrifugal force caused by the rotation of the gear-like conveying ring. Offset limits are strict; for example, for an electronic part of less than a few millimeters in size, even an offset of one millimeter may not be tolerated.

SUMMARY

An object of this present invention is to provide an apparatus for conveying (and, more generally, handling) electronic parts (such as chip-type electronic parts), whereby damage to the electronic parts can be reduced, and also the positions of the electronic parts during a conveying operation can be stabilized.

To achieve these objectives, according to one aspect of the present invention, there is provided a conveying table which is rotationally driven in a constant direction. The table includes a plurality of concave storage slots formed with identical pitches on the table's entire outer-peripheral section. These slots store chip-type electronic parts, each slot having a bottom surface, two radial side surfaces, and an inner-circumferential side surface. Further, an air hole (i.e., a conduit) is provided, having one end open on the inner-circumferential side surface and the other end communicatively connected with a negative air pressure source generating negative suction air pressure that sucks the electronic part onto the inner-circumferential side surface of the concave storage slot.

An electronic part is fed by a feed mechanism (such as a parts feeder) located in a section near the outer-peripheral section of the conveying table. The electronic part is then vacuum-suctioned by negative air pressure provided through the air hole onto the concave storage slot. In this state, one end surface of the electronic part abuts the inner-circumferential side surface. When the table rotates, the electronic part would normally move in the outer-peripheral direction due to the centrifugal force created by the rotation. In the present invention, however, because the electronic part is vacuum-suctioned through the air hole onto the inner-circumferential side surface, the electronic part is not offset when the table rotates. This mechanism thereby facilitates the measurement of electrical characteristics of the electronic parts, allowing contact electrodes of a measurement device to precisely contact outer electrodes of the electronic part.

Vacuum-suction can be employed according to two timing methods; a continuous method and a periodic method. In the continuous method, the electronic parts are kept suctioned in the storage slot during the rotation of the conveying table. In the periodic method, the electronic parts are periodically suctioned in the storage slots during periods when the rotation stops. The periodic method is performed by intermittently rotating the conveying table and allowing the rotation to periodically stop to measure characteristics of the electronic parts. One component-related difference between the two methods is that the continuous method does not require a guard for preventing the electronic parts from being radially propelled outward.

According to another aspect of the present invention, there is provided a concave storage slot having a bottom surface, two radial side surfaces, and an inner-circumferential side surface. Due to this structure, the electronic part stored therein does not slide in contact with other parts, thereby reducing the potential of damage to the outer electrodes of the electronic part.

In a preferred embodiment of the present invention, a selector mechanism is installed so that one end of the air hole communicates through a selector valve with a negative air pressure source and a positive air pressure source (which generates compressed air to eject the electronic parts). In this way, ejection of the electronic parts in the peripheral direction of the conveying table is facilitated when it is desired that the electronic parts be ejected after the table is rotated to a predetermined position. In this case, the electronic parts can be ejected by application of compressed air from an outside mechanism, but it is difficult to effectively apply the compressed air to an end surface of a target electronic part. However, as described above, making use of the air hole enables precise application of the compressed air at the end surface of the electronic part, facilitating ejection of the electronic part from the concave storage slot.

Another preferred embodiment of the present invention is that the conveying table is "block-constructed" including an upper plate and a lower plate. In this construction, the upper plate is formed so that it has notches with identical pitches on its outer-peripheral section, and a lower plate is fitted on a lower surface of the upper plate so as to close the lower portions of the notches. Further, the lower surface of the upper plate is grooved (with the grooves extending to the inner-circumferential side surface of the notch) so that the air hole is thereby formed.

The block construction is preferable to the above-described integral slot/hole arrangement because the block construction is easier to manufacture. This is especially true in manufacturing a conveying table that handles smaller electronic parts, wherein many concave storage slots must be formed, each having a width of one to several millimeters, and even smaller air holes on the inner-circumferential side surfaces of the slots must be provided.

As mentioned above, considering the manufacturing difficulties of the integrated design, it is easier to construct the conveying table by separating it into blocks comprising an upper plate and a lower plate, forming the gear-like notches on the upper plate, and making the grooves which will form the air holes on the upper plate. There are other reasons why it is easier to construct the table in blocks. For example, the upper plate can be integrally made of resin, and the lower plate can simply be in a disc form, which can be relatively easily manufactured.

The electrical characteristics of the electronic parts having the outer electrodes are measured during the conveying operation. In this case, ordinarily a pair of pin-type contact terminals of a measurement device are pressed onto the outer electrodes of the electronic part so as to form electrical conduction therewith. However, while this technique is viable, the outer electrodes may be damaged in this method.

For preventing possible damage as mentioned above, a pair of the contact electrodes contacting the outer electrodes of the electronic part, respectively, are formed on the bottom surface of the individual concave storage slots of the conveying table. In this method, when the electronic part is pushed by an insulated cushioned member from the upper side of the part, the outer electrodes and the contact electrodes of the electronic part can be reliably placed in electrical conduction with each other. If the contact electrodes are connected to the measurement device, the electrical characteristics of the electronic parts can easily be measured, and possible damage to the electronic parts can be prevented or reduced.

In a section near the peripheral section of the conveying table, a taping mechanism is provided to apply an adhesive cover tape onto a carrier tape after the electronic parts ejected from the concave storage slots are stored in storage sections of the carrier tape. The procedure from conveying through taping is thus automated, thereby greatly improving the operational speed of this procedure, as well as reducing the size and cost of the facilities used to perform these functions.

Another possibility is that instead of the taping mechanism, a package-in-case mechanism is provided, which packages multiple electronic parts ejected from the concave storage slots into cases on the basis of a predetermined quantity.

BRIEF DESCRIPTION OF THE DRAWINGS

The foregoing, and other, objects, features and advantages of the present invention will be more readily understood upon reading the following detailed description in conjunction with the drawings in which:

FIG. 5 is a cross-sectional view of an accepted-parts ejection section;

FIG. 6 is a side view of a taping device;

DESCRIPTION OF THE PREFERRED EMBODIMENTS

Figure 1:
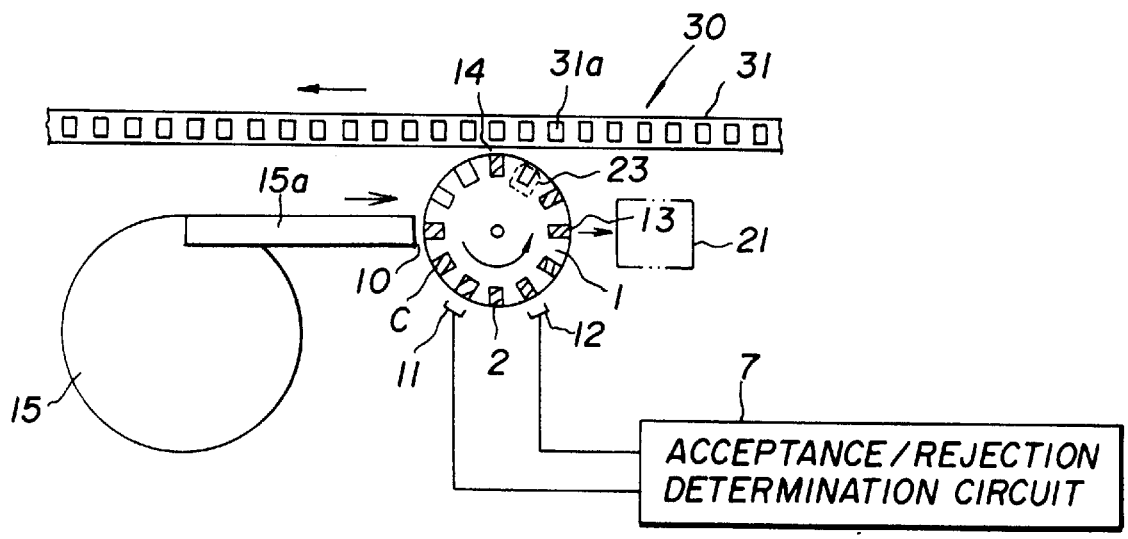
FIG. 1 is a plan view of a first preferred embodiment of a conveying apparatus (or, more generally, a parts handling apparatus) in accordance with the present invention.
Figure 2:
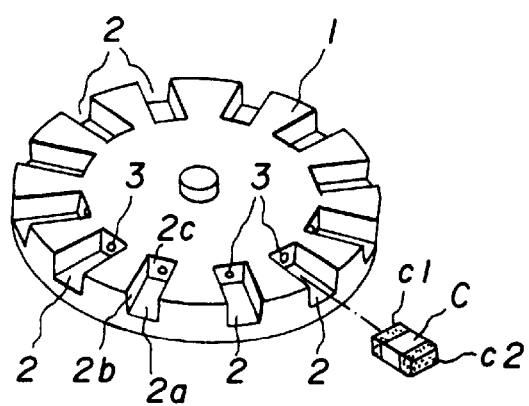
FIG. 2 is a perspective view of a conveying table.

FIG. 1 shows a first embodiment of a conveying apparatus (or, more generally, a parts handling apparatus) in accordance with the present invention. A disc-shaped conveying table 1 is rotationally driven by a drive motor (not shown in the figure) at intervals of identical pitch in the direction of the arrow. Here, "pitch" refers to an incremental amount of movement of, for instance, the table 1 or tape (to be described later). As shown in FIG. 2, the conveying table 1 has a plurality of concave storage slots 2 on its outer-peripheral section at pitch intervals which correspond to the rotational pitch intervals. The concave storage slots 2 store a series of chip-type electronic parts C. Each slot 2 has a bottom surface 2a, two radial side surfaces 2b, and an inner-circumferential side surface 2c having an opening for an air hole 3 (i.e., conduit) that is smaller than the electronic part C.

Figure 3:
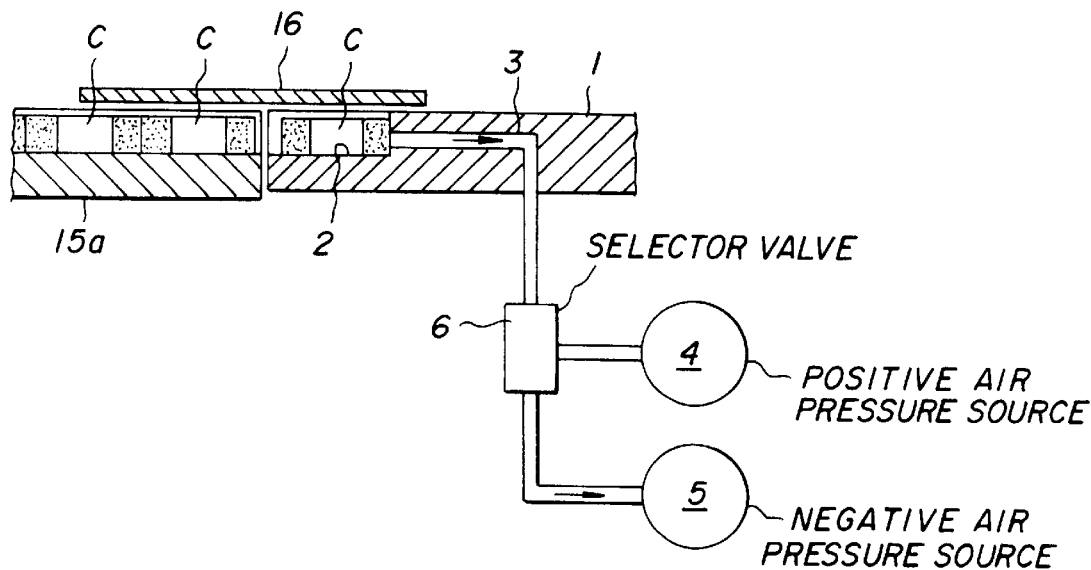
FIG. 3 is a cross-sectional view of a parts-feed section.

As shown in FIG. 3, the air hole 3 communicates with a positive air pressure source 4 and a negative air pressure source 5 through an electromagnetic selector valve 6. Only one of the positive air pressure source 4 and the negative air pressure source 5 is installed at any point in time, since the two sources are shared by all the air holes 3. However, a selector valve 6 is dedicated to each of the holes 3, so there is an identical number of selector valves 6 and holes 3.

The selector valve 6 receives command signals from an acceptance/rejection determination circuit 7 and, based upon the signals, the valve 6 selectively communicates the positive air pressure source 4 or the negative air pressure source 5 with the air hole 3. More specifically, while the electronic part C is being stored and conveyed, the air hole 3 communicates with the negative air pressure source 5 and the electronic part C is secured onto the inner-circumferential side surface 2c of the concave storage slot 2.

As shown in FIG. 1, the conveying table 1 has, on its periphery, a feed section 10, which feeds the table 1 with the electronic parts C, a measurement section 11, which makes measurements on the electronic parts C to determine the parts' electrical characteristics, a rejected-parts ejection section 13, and an accepted-parts ejection section 14.

In a section corresponding to the feed section 10, a feed device 15 is provided, such as a parts feeder. An outlet of a linear track 15a of the feed device 15 is set close to the outer-peripheral section of the table 1 in the radial direction. As shown in FIG. 3, the electronic parts C continuously conveyed through the linear track 15a are individually led into the concave storage slots 2 by means of vacuum suction through the air holes 3.

In order to improve the effectiveness of the suction force, the outlet of the linear track 15a should be positioned as close as possible to the outer-peripheral surface of the table 1, and a cover 16 should be placed over the upper side of the communication section.

Figure 4:
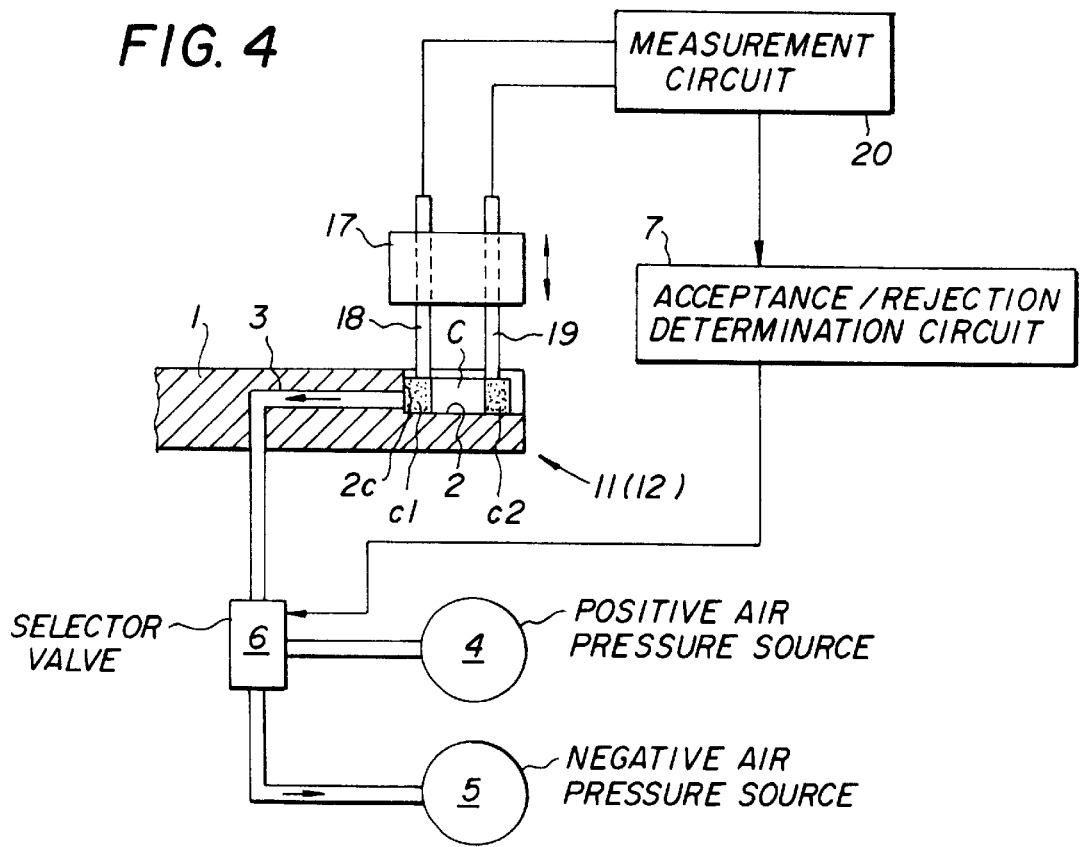
FIG. 4 is a cross-sectional view of measurement sections.

An electronic part C stored in a concave storage slot 2 of the conveying table 1 passes the measurement sections 11 and 12 (shown in FIG. 4), wherein electrical characteristics of the part C are measured. The measurement sections 11 and 12 each have a terminal stand 17 which can be raised and which includes a pair of measurement terminals 18 and 19, and a measurement circuit 20 with which the terminals 18 and 19 are linked.

When the electronic part C retained in the concave storage slot 2 moves beneath the lower sections of the terminals 18 and 19, the terminal stand 17 moves down to let the terminals 18 and 19 contact two electrodes c1 and c2 of the electronic part C. In this state, due to the vacuum suction through the air hole 3, the position of the electronic part C is stabilized such that the end surface of the electronic part C is sucked onto the inner-circumferential side surface 2c. This stable position, in turn, provides stable contact between the terminals 18 and 19 and the electrodes c1 and c2 of the electronic part C, respectively, thereby enabling stable measurement of the electrical characteristics.

In the first embodiment, the air hole 3 is provided only in the inner-circumferential side surface 2c of the concave storage slot 2. However, air holes 3 can be provided in multiple surfaces forming the storage slot 2. For instance, air holes 3 can be provided in both the inner-circumferential side surface 2c and one of the two radial side surfaces 2b, or in both the inner-circumferential side surface 2c and the bottom surface 2a. In these cases where the electronic part C is suctioned onto two surfaces, positioning precision is increased.

The first embodiment has two measurement sections 11 and 12 on the peripheral section of the conveying table 1, as shown in FIG. 1. However, a single measurement section or three or more measurement sections are also envisioned.

The acceptability of an electronic part C is determined on the basis of the results of the measurements of its electrical characteristics conducted in the measurement sections 11 and 12. The results of the measurements comprising various values are transferred from the measurement circuit 20 to the acceptance/rejection determination circuit 7, wherein a determination is made as to whether or not the electronic part C is acceptable.

If the electronic part C is determined to be unacceptable, it is ejected into a rejected-parts collection box 21. When the unacceptable electronic part C arrives at the rejected-parts ejection section 13, the selector valve 6 controlled by the acceptance/rejection determination circuit 7 selects the positive air pressure source 4. Concurrently, compressed air is released through the air hole 3 to eject the unacceptable electronic part C into the rejected-parts collection box 21. Since the electronic part C receives the air pressure on its end surface almost perpendicularly, it is reliably ejected in the peripheral direction (i.e., in the radial direction) without failure.

If the electronic part C is determined to be acceptable, it is ejected onto a carrier tape 31 described later. When the acceptable electronic part C arrives at the accepted-parts ejection section 14, the selector valve 6 selects the positive air pressure source 4. Concurrently, compressed air is released through the air hole 3 to eject the electronic part C onto the carrier tape 31. As shown in FIG. 5, to ensure that the electronic part C is guided onto the carrier tape 31, an upper area of the carrier tape 31 from the conveying table 1 should be covered with a guiding means 22.

As shown in FIGS. 1 and 6, a taping device 30 is located in a section corresponding to the accepted-parts ejection section 14. The taping device 30 feeds the carrier tape 31 a direction which is tangential to the peripheral end of the conveying table 1 and at the same height as the concave storage slot 2 of the conveying table 1.

As shown in FIG. 6, the taping device 30 mainly consists of a feed roller 32, a guide roller 33, a feed roller 35, a press roller 36, a guide roller 37, and a reel roller 38. The feed roller 32 feeds the carrier tape 31 having a concave section 31a. The guide roller 33 guides the carrier tape 31. The feed roller 35 feeds a cover tape 34. The press roller 36 presses and adheres the cover tape 34 to the carrier tape 31.

The reel roller 38 is driven by a drive means (not shown in the figures) in the direction of the arrow, intermittently at intervals of one pitch. The drive timing of the reel roller 38 is regulated to be synchronous with the drive timing of the conveying table 1. Accordingly, both the concave storage slot 2 and the carrier tape 31 synchronously come to rest at the accepted-parts ejection section 14. Then, as shown in FIG. 5, the electronic part C stored in the concave storage slot 2 is blown out by compressed air passing through the air hole 3. The part C is ejected onto the carrier tape 31 and stored in the concave section 31a. After the electronic part C is thus stored in the concave section 31a, the cover tape 34 is adhered onto the carrier tape 31 to close the concave section 31a.

When an unacceptable electronic part C is ejected at the rejected-parts ejection section 13, the concave storage slot 2 does not have anything stored therein. When the conveying table 1 and the taping device 30 are regulated to drive synchronously, this results in a concave section 31a that does not included an electronic part C stored therein, which section 31a would be subsequently closed by the cover tape 34.

To resolve the above problem, as shown in FIG. 1, a sensor 23 is installed immediately before the accepted-parts ejection section 14. The sensor 23 checks whether or not an electronic part C is stored in the concave storage slot 2. If the sensor 23 does not detect an electronic part C stored in the concave storage slot 2, the taping device 30 is stopped for one pitch interval while the conveying table 1 is rotated, thereby enabling all the concave section 31a to store the electronic parts C so that there are no empty concave sections 31a.

As stated above, the parts feeder 15 feeding the electronic parts C, the conveying table 1 measuring the electrical characteristics of the parts C, and the taping device 30 packaging the parts C are all cooperatively linked. This linking enables characteristics-selection of the parts C as produced and direct feeding of the parts C to the taping device 30. Consequently, production, characteristics-selection, and packaging can be automated to a complete or large extent, thereby realizing not only great improvement in operation speed, but reduction in size of the parts testing and packaging facilities and consequent reduction in cost.

Figure 7:
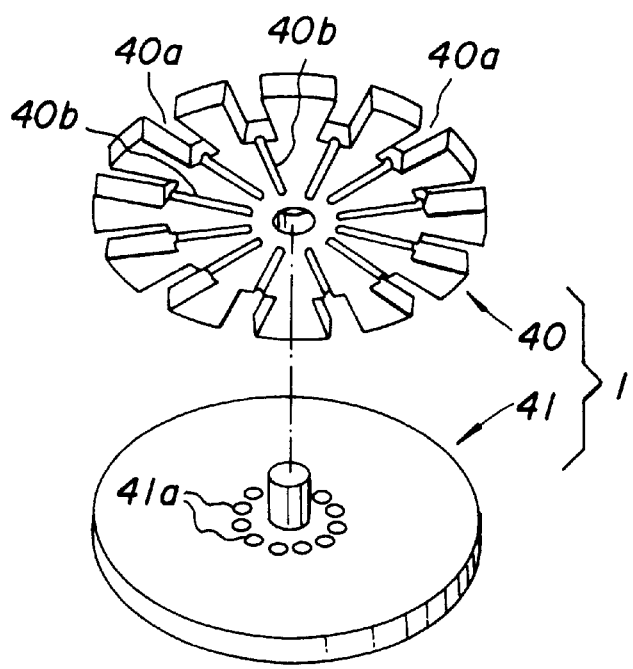
FIG. 7 is an exploded perspective view of a second preferred embodiment of the conveying apparatus.
Figure 8:
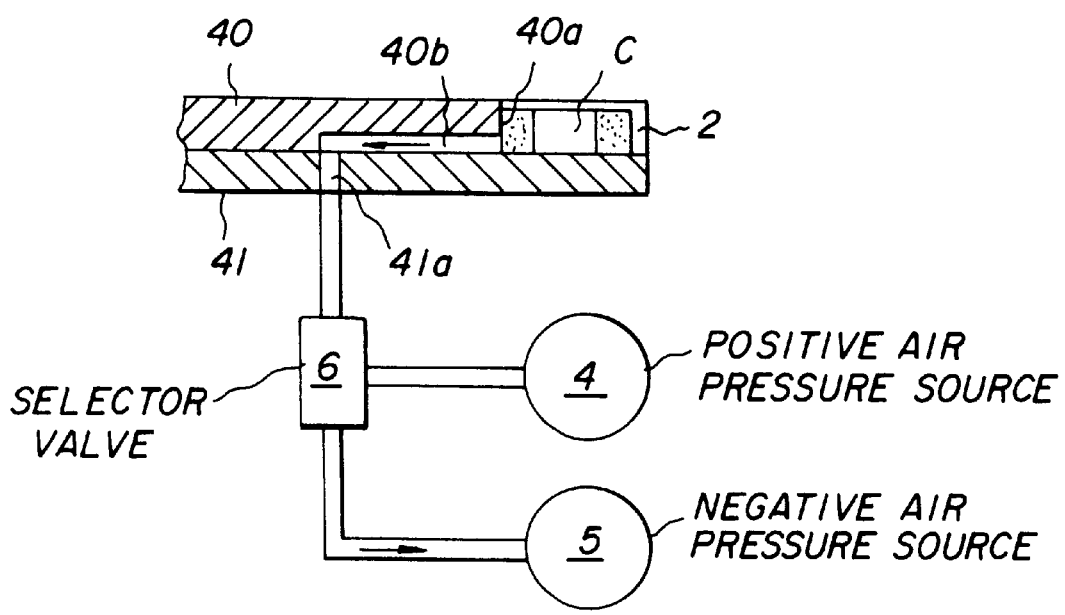
FIG. 8 is a cross-sectional view of the conveying apparatus in FIG. 7.

FIGS. 7 and 8 show a second embodiment of a conveying table 1 in accordance with the present invention. Although in the first embodiment, the conveying table 1 is constructed in an integral manner, in the second embodiment, the table 1 is constructed from separate blocks. The outer-peripheral section of an upper plate 40 is formed so that it has notches 40a with identical pitches, and a lower surface of the upper plate 40 is formed so as to have grooves 40b extending to the inner-circumferential side surface.

The lower plate 41 is round with the same diameter as the upper plate 40 and is fitted with the lower surface of the upper plate 40 by using an adhesive or screw or other mechanism. The lower plate 41 is formed so as to have pass-through holes 41a individually corresponding to the inner-circumferential ends of the grooves 40b. With the upper plate 40 and the lower plate 41 fixed together, the concave storage slot 2 is formed between the notch 40a and the upper surface of the lower plate 41, and the air hole 3 is formed between the groove 40b and the upper surface of the lower plate 41.

The above-described block structure in which the upper plate 40 and lower plate 41 are joined together, makes the device easier to manufacture, thereby greatly decreasing the manufacturing cost.

Figure 9:
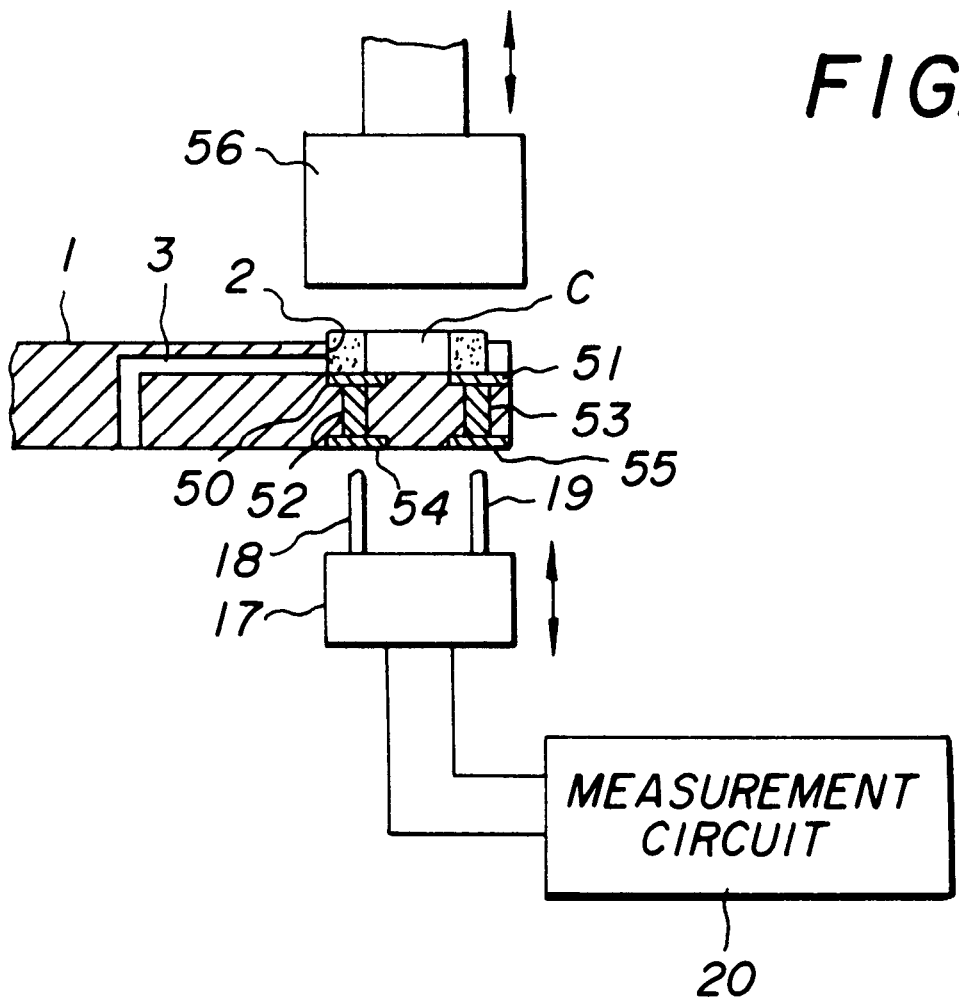
FIG. 9 is a cross-sectional view of a third preferred embodiment of the conveying apparatus.

FIG. 9 shows a third embodiment in accordance with the present invention. In this embodiment, the conveying table 1 has a pair of contact electrodes 50 and 51 formed on the bottom surface 2a of the concave storage slot 2. The contact electrodes 50 and 51 are connected to distal electrodes 54 and 55 via the through-hole electrodes 52 and 53, respectively. Under the conveying table 1, a terminal stand 17 is installed that can be raised (i.e., moved toward the distal electrodes 54 and 55).

The terminal stand 17 has measurement terminals 18 and 19 which can respectively be connected to the distal electrodes 54 and 55. The measurement terminals 18 and 19 are connected to a measurement circuit 20. The electronic part C is pressed by an insulated cushioned member 56 and then the terminal stand 17 is lifted. By this operation, the external electrodes c1 and c2 of the electronic part C and the contact electrodes 50 and 51 are respectively connected. The measurement terminal 18 and 19 are respectively connected to the distal electrodes 54 and 55. Then, the electrical characteristics of the electronic part C can be measured. (Incidentally, the depth of the concave storage slot 2 should be dimensioned so as to be the same as or less than the thickness of the electronic part C so that the electronic part C can be surely pressed by the cushioned member 56.)

With such a configuration as described above, because the pin terminals 18 and 19 need not be pressed to the electrodes c1 and c2, possible damage to the electrodes c1 and c2 and the electronic parts C (such as abrasions on the electrodes c1 and c2) can be prevented or reduced.

The third embodiment can be used in conjunction with the table 1 shown in FIG. 2 or the table having the block construction shown in FIG. 7 (comprising an upper plate 40 and the lower plate 41). In the block construction, manufacturing can be facilitated by forming the desired groove and notch pattern at a preliminary stage, along with the electrodes, such as the contact electrodes 50 and 51 and the distal electrodes 54 and 55 on the upper and lower surfaces of the lower plate 41, respectively.

Figure 10:
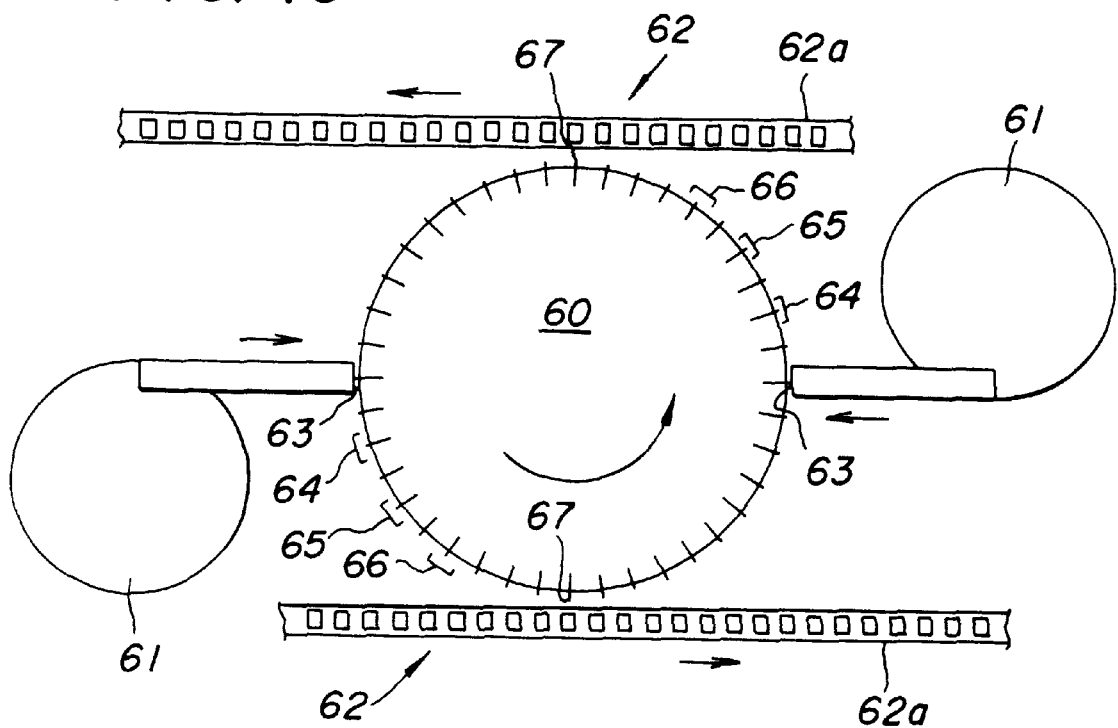
FIG. 10 is a plan view of a fourth preferred embodiment of the conveying apparatus in accordance with the present invention.

FIG. 10 shows a fourth embodiment of the conveying apparatus. In this embodiment, two feed devices 61, such as a parts feeders, are installed on both sides of a table 60. Further, two taping devices 62 are installed. In FIG. 10, the reference numeral 63 indicates a feed section, numerals 64 and 65 individually indicate measurement sections, numeral 66 indicates a rejected-parts ejection section, and numeral 67 indicates an accepted-parts ejection section 14. Two tapes 62a are fed in opposite directions to each other.

With this apparatus, the conveying table 60 is larger than the conveying table 1.

However, the apparatus is characterized in that two taping devices 62 operate with the single conveying table 60, which provides higher operation speed and efficiency than the apparatus shown in FIG. 1 because parts are being tested and packaged in parallel.

Figure 11:
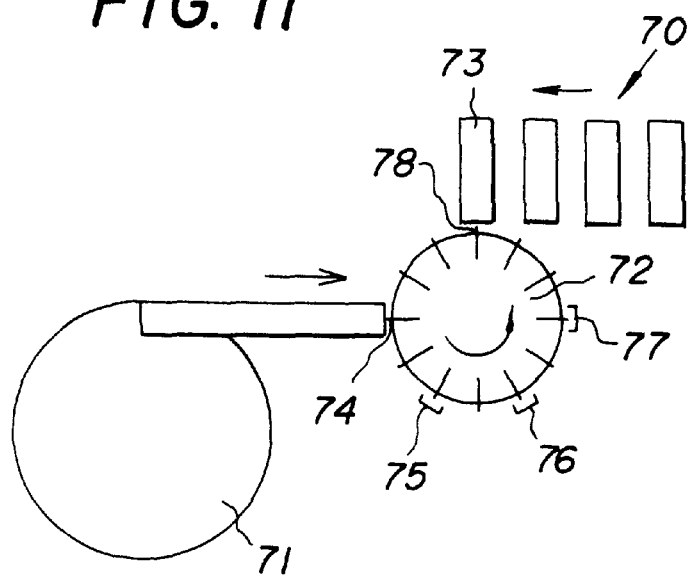
FIG. 11 is a plan view of a fifth preferred embodiment of the conveying apparatus in accordance with the present invention.

FIG. 11 shows a fifth embodiment of the conveying apparatus. In this embodiment, a package-in-case device 70 is used as a packaging device. Accepted electronic parts are conveyed from a parts feeder 71 through a conveying table 72 and are ejected and then packaged by the package-in-case device 70 in cases 73. Each of the cases 73 accommodate a predetermined number of electronic parts.

When the package-in-case 73 is filled with a predetermined number of parts, the case 73 is driven for one pitch in the direction of the arrow. In FIG. 11, the reference numeral 74 indicates a feed section, numerals 75 and 76 individually indicate measurement sections, numeral 77 indicates a rejected-parts ejection section, and numeral 78 indicates an accepted-parts ejection section.

The apparatus in this embodiment provides the similar advantages as the apparatus shown in FIG. 1. The FIG. 11 embodiment can also use the replicated design shown in the FIG. 10 embodiment, e.g., employing two or more package-in-case devices 70 installed for the single conveying table 72.

The apparatus in accordance with the present invention can be used for a wide variety of electronic parts, such as, but not limited to, ceramic capacitors, chip resistors, and chip-type piezoelectric parts.

Instead of driving the conveying table in an intermittent manner, the conveying table can be driven in a continuous manner at a constant or non-constant speed.

In the embodiments described above, electrical characteristics are measured during or between table rotation. However, the measurement of electrical characteristics can be replaced or supplemented with other processes, such as printing. In other embodiments, only a covering operation is performed.

As specifically described above, in the present invention, since the concave storage slots that store the chip-type electronic parts in sequence are provided on the outer-peripheral section of the conveying table, and since the air hole opening is provided on the inner-circumferential side surface and communicates with the negative air pressure source, the electronic parts can be reliably fed into the concave storage slot, preventing the parts from dropping-out.

Another advantage of the present invention is that since, during the rotation of the table, the electronic part is retained in a concave storage section and consequently the part does not slide in contact with other parts, possible abrasions and scratches on the part can be prevented.

Another advantage of the present invention is that since, during the rotation of the table, an electronic part is suctioned onto the inner-circumferential side surface of the concave storage slot, the electronic part can be retained in a constant and steady position. This enables processes, such as electrical characteristics measurement of the electronic parts and high precision printing, to be reliably performed.

The preferred embodiments are merely illustrative and should not be considered restrictive in any way. The scope of the invention is to be measured by the appended claims, rather than the preceding description, and all variations and equivalents which fall within the range of the claims are intended to be embraced therein.

What is claimed is:

1. An electronic parts handling apparatus comprising:

a conveying table having an outer-peripheral section, said outer-peripheral section including a plurality of storage slots arranged at equal intervals around the entire periphery of the conveying table, each slot including a bottom surface, an inner-circumferential side surface, and radial side surfaces for storing electronic parts;

a plurality of conduits which pass through said conveying table and terminate at respective inner-circumferential side surfaces of said slots;

a first source of air pressure connected to said plurality of conduits, wherein said air pressure is released outward through said conduits to eject electronic parts from said slots;

a measurement section for making measurements on said electronic parts in said slots, wherein each slot has a pair of contact electrodes disposed formed on the bottom surface of the slot which are in contact with first and second electrodes of an electrical part held in the slot, and said measurement section includes a movable terminal stand having first and second measurement terminals which are positioned so as to electrically engage said pair of contact electrodes, without directly contacting said first and second electrodes of the electronic part.

2. An electronic parts handling apparatus of claim 1, wherein said first source of air pressure comprising a positive air pressure source for expelling said parts from their respective slots.

3. An electronic parts handling apparatus of claim 2, further including a second source of air pressure connected to said conduits comprising a negative air pressure source for retaining said parts in their respective slots.

4. An electronic parts handling apparatus of claim 2, further including a plurality of valves connected to respective conduits for selectively applying either said negative air pressure source or said positive pressure source to respective slots.

5. An electronic parts handling apparatus according to claim 1, further including a feed device having a track which extends close to said outer-peripheral section of said table, for feeding said electronic parts to respective slots.

6. An electronic parts handling apparatus according to claim 1, further including a determination circuit for receiving measurements from said measurement section and for making an assessment whether said electronic parts are acceptable or unacceptable, and for retaining or expelling said parts from their respective slots on the basis of said assessment by providing either a suction force or an expelling force through the application of air pressure through said conduits.

7. An electronic parts handling apparatus according to claim 1, further including a taping device disposed near said out-peripheral section of said table for receiving said electronic parts in concave sections of a tape, such that each concave section receives at least one electronic part.

8. An electronic parts handling apparatus according to claim 7, wherein movement of said tape is made to be synchronous with rotation of said table, except that the movement of said tape is halted if it is detected that a slot disposed near said taping device contains no electronic part.

9. An electronic parts handling apparatus according to claim 7, wherein said tape is controlled in such a manner that each concave section receives a prescribed plural number of electronic parts.

10. An electronic parts handling apparatus according to claim 1, further comprising additional conduits which terminate at surfaces of said slots other than said inner-circumferential side surfaces.

11. An electronic parts handling apparatus according to claim 1, wherein said table comprises a first plate having a series of notches in said outer-peripheral section, and a series of grooves formed in a lower surface of an inner-peripheral section of said table, and a second plate having a plurality of through-holes formed therein corresponding in position to radially inner ends of said grooves, wherein said first plate is placed on top of said second plate, and wherein, when said first plate is combined with said second plate, said notches form said slots and said grooves form said conduits.

12. An electronic parts handling apparatus according to claim 1, further including an insulating member for pressing the electrical part against said pair of contact electrodes.

13. An electronic parts handling apparatus according to claim 1, further including:

at least two feed devices for supplying electronic parts to two separate sections of said table; and at least two taping devices for receiving said electronic parts from said table at two separate sections of said table.

14. An electronic parts handling apparatus of claim 1, wherein said storage slots are formed in a top surface of said conveying table.

* * * * *